(12) United States Patent
Beatson et al.

(10) Patent No.: US 7,442,641 B2
(45) Date of Patent: Oct. 28, 2008

(54) INTEGRATED BALL AND VIA PACKAGE AND FORMATION PROCESS

(75) Inventors: David T. Beatson, Kennett Square, PA (US); Jamin Ling, Horsham, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 341 days.

(21) Appl. No.: 11/123,858

(22) Filed: May 5, 2005

(65) Prior Publication Data
US 2005/0260791 A1    Nov. 24, 2005

Related U.S. Application Data

(60) Provisional application No. 60/660,486, filed on Mar. 9, 2005, provisional application No. 60/570,704, filed on May 12, 2004.

(51) Int. Cl.
*H01L 21/44* (2006.01)
*H01L 23/52* (2006.01)
*H01L 23/48* (2006.01)
*H01L 23/40* (2006.01)
*H01L 23/538* (2006.01)

(52) U.S. Cl. .................. 438/667; 438/668; 257/773; 257/774; 257/E23.174

(58) Field of Classification Search ........... 438/667, 438/668; 257/773, 774, E23.174
See application file for complete search history.

(56) References Cited

U.S. PATENT DOCUMENTS

| 6,291,898 | B1 * | 9/2001 | Yeh et al. ........... 257/786 |
| 6,414,380 | B1 * | 7/2002 | Ino ..................... 257/668 |
| 2002/0027265 | A1 | 3/2002 | Yoneda et al. |
| 2004/0025332 | A1 | 2/2004 | Haberer et al. |

FOREIGN PATENT DOCUMENTS

| JP | 02-112264 A | 4/1990 |
| WO | WO 03/067940 A2 | 8/2003 |

* cited by examiner

*Primary Examiner*—Luan Thai
(74) *Attorney, Agent, or Firm*—Christopher M. Spletzer

(57) ABSTRACT

A method of processing a semiconductor device is provided. The method includes providing a semiconductor device supported by a carrier structure. The carrier structure defines a plurality of vias from a first surface of the carrier structure adjacent the semiconductor device to a second surface of the carrier structure. The method also includes extending a conductor through one of the vias such that a first end of the conductor at least partially extends below the second surface. The method also includes electrically coupling another portion of the conductor to a portion of the semiconductor device.

11 Claims, 11 Drawing Sheets

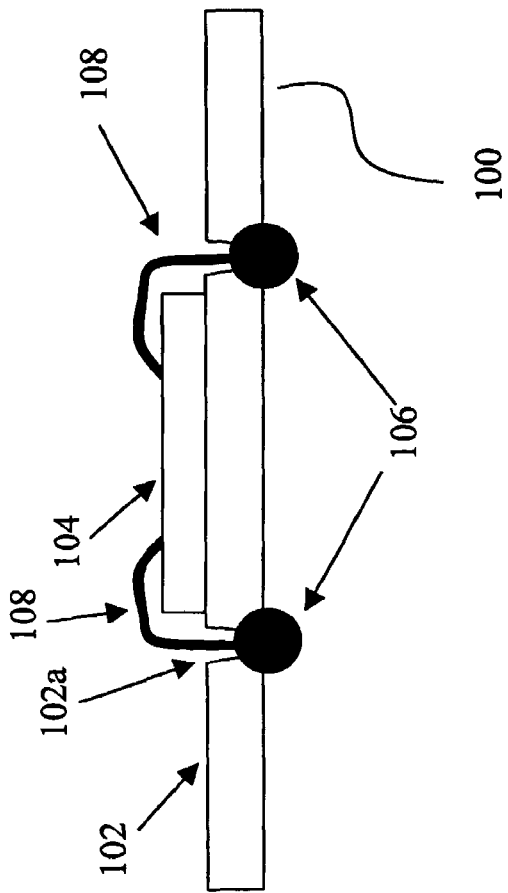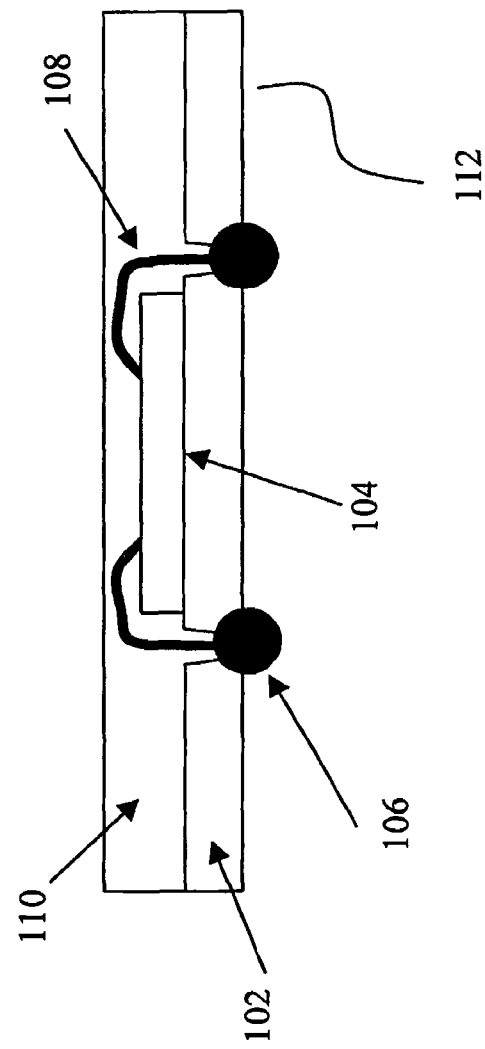

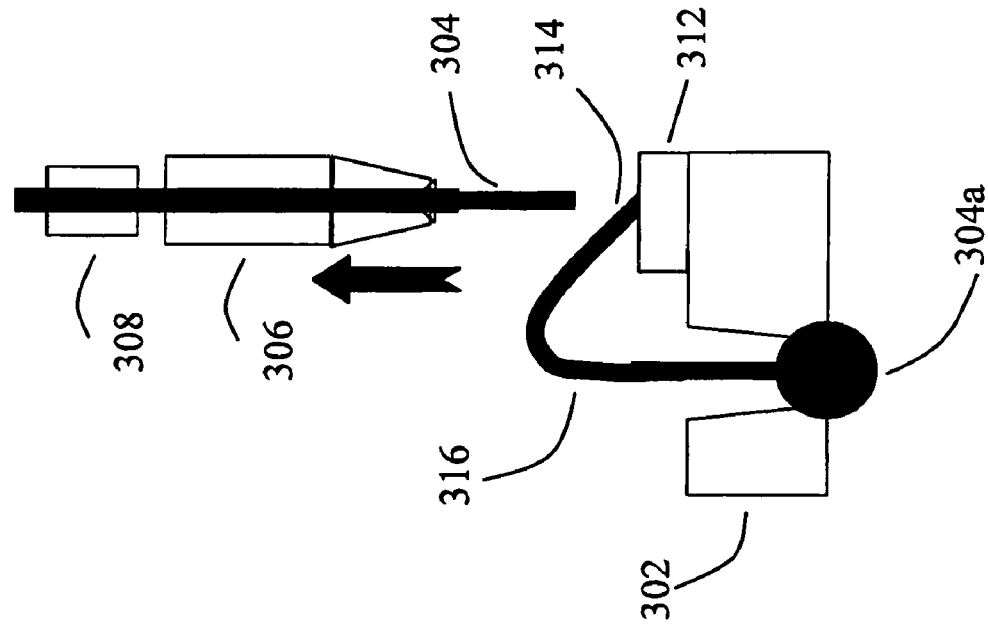
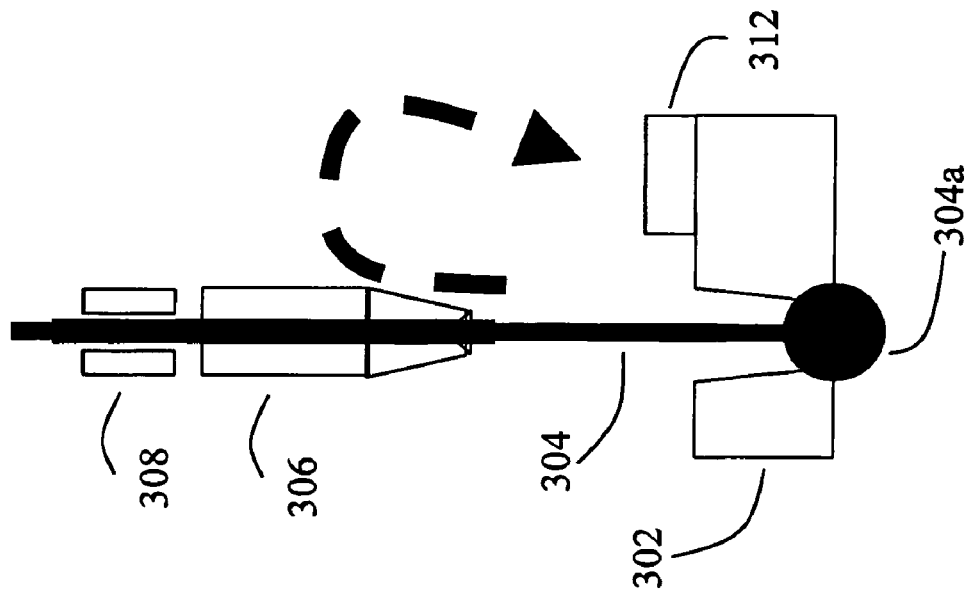

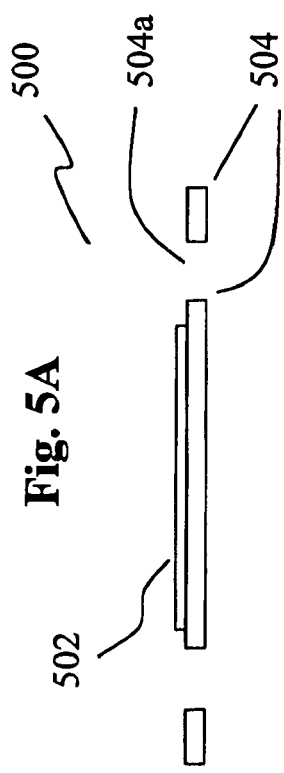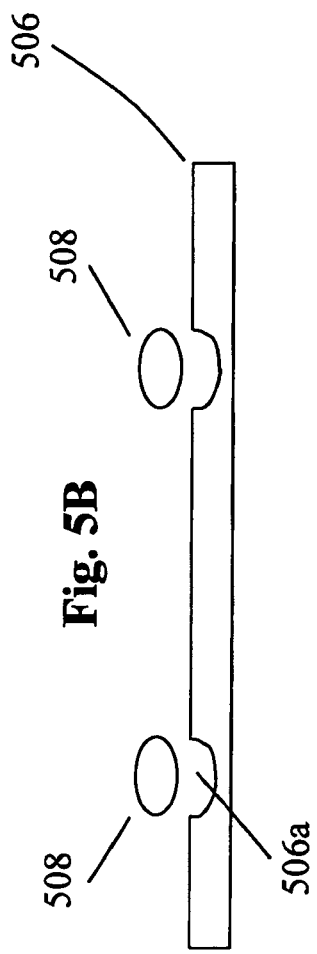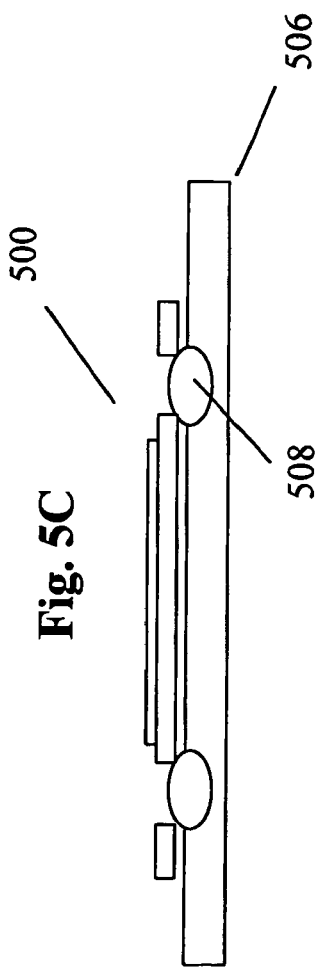

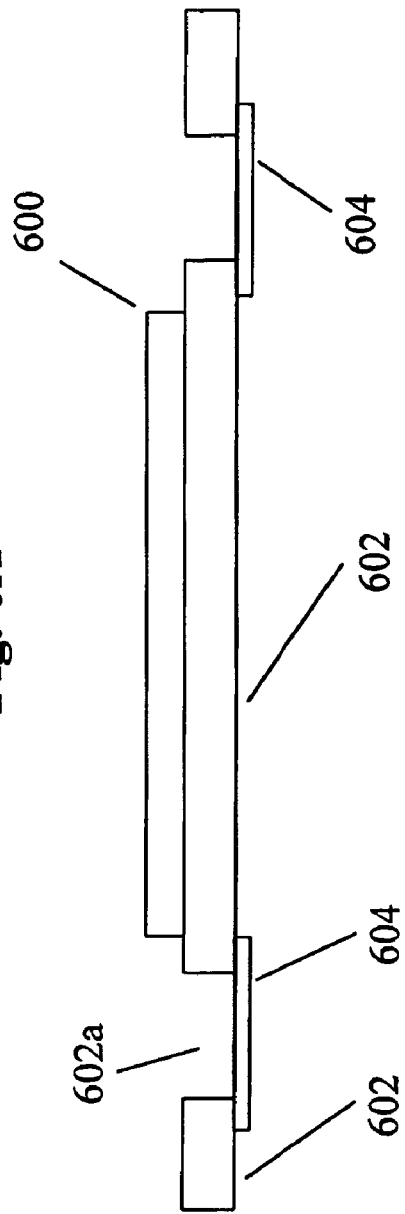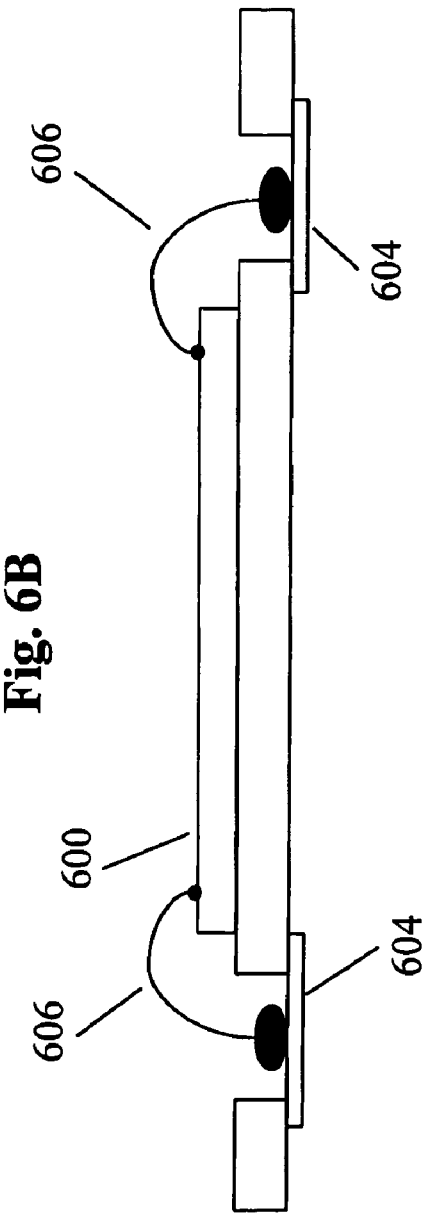

INTEGRATED BALL AND VIA PACKAGE AND FORMATION PROCESS

CROSS-REFERENCES TO RELATED APPLICATIONS

The present application is related to and claims priority from U.S. Provisional Application Ser. No. 60/570,704, filed May 12, 2004, and from U.S. Provisional Application Ser. No. 60/660,486, filed Mar. 9, 2005, which are incorporated herein by reference in their entirety.

FIELD OF THE INVENTION

The present invention relates to techniques for processing semiconductor devices, and more particularly, to techniques for providing an electrical connection to a semiconductor device through a carrier structure.

BACKGROUND OF THE INVENTION

In the processing and packaging of semiconductor devices (e.g., BGA devices), an integrated circuit device (e.g., a semiconductor die or chip) is often mounted on a top surface of a multi-layer printed circuit board, where the printed circuit board includes plated vias that extend from the top surface of the printed circuit board to a bottom surface of the printed circuit board. Solder balls are conductively coupled (e.g., using a solder reflow process) to contact pads of the plated vias on the bottom surface of the printed circuit board. Wire bonds conductively couple (1) contact pads of the plated vias on the top surface of the printed circuit board with (2) a portion of the integrated circuit device (e.g., contact pads on the integrated circuit device). Thus, the contact pads of the integrated circuit device are conductively coupled to the solder balls through the plated vias of the printed circuit board.

Unfortunately, such conventional processing and packaging of integrated circuit devices suffers from excessive costs and complex processes. Furthermore, electrical performance is often compromised due to these complex processes and material sets. For example, the multi-layer printed circuit board used to support the integrated circuit devices tends to be expensive. Likewise, the solder ball material and the associated reflow process also tend to be quite expensive.

Thus, it would be desirable to provide a method of processing semiconductor/integrated circuit devices that overcomes one or more of the above-recited deficiencies.

BRIEF SUMMARY OF THE INVENTION

According to an exemplary embodiment of the present invention, a method of processing a semiconductor device is provided. The method includes providing a semiconductor device supported by a carrier structure. The carrier structure defines a plurality of vias from a first surface of the carrier structure adjacent the semiconductor device to a second surface of the carrier structure. The method also includes extending a conductor through one of the vias such that a first end of the conductor at least partially extends below the second surface. The method also includes electrically coupling another portion of the conductor to a portion of the semiconductor device.

According to another exemplary embodiment of the present invention, a semiconductor device is provided. The semiconductor device includes an integrated circuit device supported by a carrier structure. The carrier structure defines a plurality of vias from a first surface of the carrier structure adjacent the integrated circuit device to a second surface of the carrier structure. The semiconductor device also includes a plurality of conductors. Each of the conductors extends through one of the vias such that a first end of each conductor at least partially extends below the second surface, and another portion of each conductor is electrically coupled to a portion of the integrated circuit device.

According to yet another exemplary embodiment of the present invention, a method of processing a semiconductor device is provided. The method includes providing a semiconductor device supported by a carrier structure. The carrier structure defines a plurality of vias from a first surface of the carrier structure adjacent the semiconductor device to a second surface of the carrier structure. The method also includes providing a template defining a plurality of troughs in a first surface of the template. The method also includes locating conductive contacts at least partially within the troughs. The method also includes aligning the semiconductor device above the template such that at least a portion of the plurality of vias align with respective ones of the conductive contacts. The method also includes wire bonding a first end of a conductor to one of the conductive contacts, and wire bonding a second end of the conductor to a portion of the semiconductor device.

According to yet another exemplary embodiment of the present invention, a method of processing a semiconductor device is provided. The method includes providing a semiconductor device supported by a carrier structure. The carrier structure defines a plurality of vias from a first surface of the carrier structure adjacent the semiconductor device to a second surface of the carrier structure. A conductive contact is provided below at least a portion of the vias adjacent the second surface of the carrier structure. The method also includes wire bonding a first end of a conductor to one of the conductive contacts, and wire bonding a second end of the conductor to a portion of the semiconductor device.

According to yet another exemplary embodiment of the present invention, a semiconductor device is provided. The semiconductor device includes an integrated circuit device supported by a carrier structure. The carrier structure defines a plurality of vias from a first surface of the carrier structure adjacent the integrated circuit device to a second surface of the carrier structure. The semiconductor device also includes a plurality of conductive contacts positioned adjacent the second surface of the carrier structure. Each of the conductive contacts is at least partially aligned with a respective one of the plurality of vias. The semiconductor device also includes a plurality of conductors. Each of the conductors extends at least partially through one of the vias. A first end of each conductor is conductively coupled to a respective one of the conductive contacts, and a second end of each conductor is conductively coupled to a portion of the semiconductor device.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1 is a side view of a wire bonded semiconductor device in accordance with an exemplary embodiment of the present invention;

FIG. 2 is a side view of an encapsulated wire bonded semiconductor device in accordance with an exemplary embodiment of the present invention;

FIGS. 3A-3E are illustrations of a wire bonding operation for processing a semiconductor device in accordance with an exemplary embodiment of the present invention;

FIGS. 5A-5F are side views of a processing operation of a semiconductor device in accordance with an exemplary embodiment of the present invention;

FIGS. 6A-6D are side views of another processing operation of a semiconductor device in accordance with an exemplary embodiment of the present invention;

DETAILED DESCRIPTION OF THE INVENTION

Figure 3C:
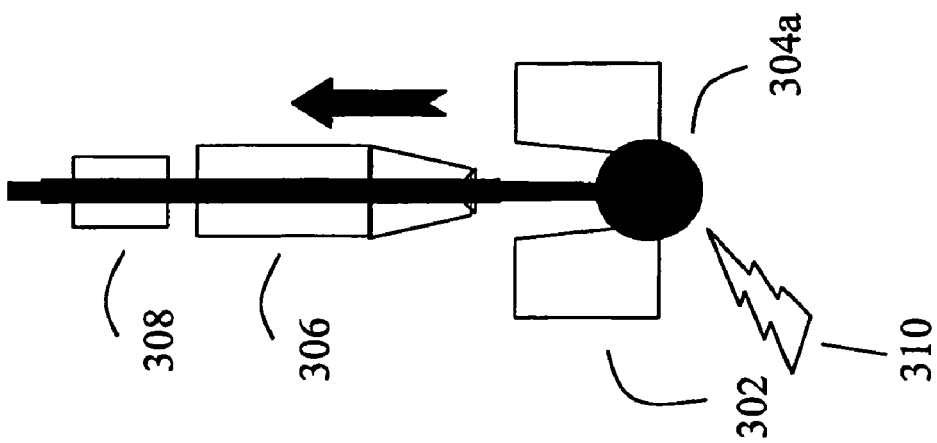

As used herein, the terms semiconductor device and integrated circuit device are intended to refer to any device (bare die or packaged) having semiconductor properties such as a die, chip, packaged device, etc. Further, the terms may be used interchangeably. Further still, the term semiconductor device may refer to a processed integrated circuit device (e.g., a chip or die may be processed in that it is mounted to a carrier or substrate, wire bonded to electrical contacts, etc.).

As used herein, the term contact pad is intended to refer to any conductive area used to transmit or receive a signal (e.g., signal, power or ground) from a semiconductor device or a substrate/carrier, and is not limited to any particular configuration. For example, a contact pad may be a conductive area on a semiconductor chip configured to receive an end of a wire loop. Likewise, a contact pad may be a conductive area on a carrier or substrate configured to receive another end of a wire bonded loop.

As will be explained through various exemplary embodiments below, the present invention provides cost efficient packaged semiconductor devices (and cost efficient methods of processing semiconductor devices). The present invention has particular applicability to packaged semiconductor devices that utilize conductive balls/spheres on a surface thereof for providing electrical contact with the packaged device (e.g., BGA devices); however, the present invention is not limited thereto. According to certain exemplary embodiments of the present invention, in a single process (1) a conductive stand-off (e.g., a conductive ball or sphere) may be formed at least partially below a carrier structure, (2) a conductive path (a wire) may be formed through a via in the carrier structure, and (3) an interconnect (e.g., a wire bond) may be provided on the semiconductor die.

Further, according to certain exemplary embodiments of the present invention, a three-dimensional packaging interconnect with different sizes of balls for second level interconnection (e.g., for different pitch demands) is provided.

FIG. 1 is a side view of semiconductor device 100. Semiconductor device 100 includes integrated circuit device 104 (e.g., a semiconductor die) supported by carrier structure 102. Although integrated circuit device 104 is illustrated as being in direct contact with carrier structure 102, it is not limited thereto, as another structure may be provided therebetween. Further, although integrated circuit device 104 is illustrated as a single device, stacked devices (e.g., a plurality of dies/chips on top of one another) may be supported on carrier structure 102, where one or more of the stacked devices is conductively coupled through the carrier structure according to the present invention.

Carrier structure 102 may be constructed in any of a number of configurations and may include any of a number of materials. For example, carrier structure 102 may be a printed circuit board, laminated substrate, or a ceramic carrier; however, as will be explained herein, carrier structure 102 may desirably be fabricated of a simple and inexpensive construction. For example, carrier structure 102 may be a polymeric/plastic sheet (e.g., a sheet of polystyrene, polyurethane, polyimide, etc.).

Carrier structure 102 defines a number of apertures 102a that extend from (1) a first surface adjacent integrated circuit device 104 to (2) a second surface away from integrated circuit device 104. Apertures 102a are not necessarily of any particular shape. In FIG. 1 apertures 102a are shown as having a tapered shape to accommodate a wire bonding tool (as will be explained below), but they are not limited to such a configuration.

A conductive path (e.g., wire including materials such as gold, copper, aluminum, palladium, alloys thereof, etc.) is provided from integrated circuit device 104 to the lower surface of carrier structure 102. More specifically, this conductive path includes a conductive ball 106 (e.g., a solidified free air ball) and a wire 108 extending therefrom and being wire-bonded to a portion of integrated circuit device 104 (e.g., a contact pad of integrated circuit device 104). Preferably, conductive ball 106 is formed from a portion of wire 108 using, for example, an electronic flame-off wand (i.e., EFO wand). Details of the construction of semiconductor device 100 will be explained in greater detail below, for example, in connection with FIGS. 3A-3E.

FIG. 2 illustrates semiconductor device 112 which is substantially similar to semiconductor device 100 illustrated in FIG. 1 except that semiconductor device 112 includes encapsulant 110 which encapsulates integrated circuit device 104, conductor 108, and a portion of conductive ball 106.

While a single semiconductor device (100 or 112) is illustrated in FIG. 102, in certain circumstances it is practical to process the semiconductor devices in an array format. For example, a plurality of integrated circuit devices may be processed on a larger carrier structure and singulated therefrom after the wire bonding or other processing (e.g., encapsulation) is complete.

FIGS. 3A-3E illustrate a portion of a method of processing a semiconductor device. At FIG. 3A, a portion of a wire bonding system is illustrated including (1) wire bonding tool 306 (e.g., capillary 306), (2) wire 304 which extends through a passage defined by wire bonding tool 306, and (3) wire clamp 308 which effects the movement of wire 304 through the passage defined by wire bonding tool 306.

Figure 3B:
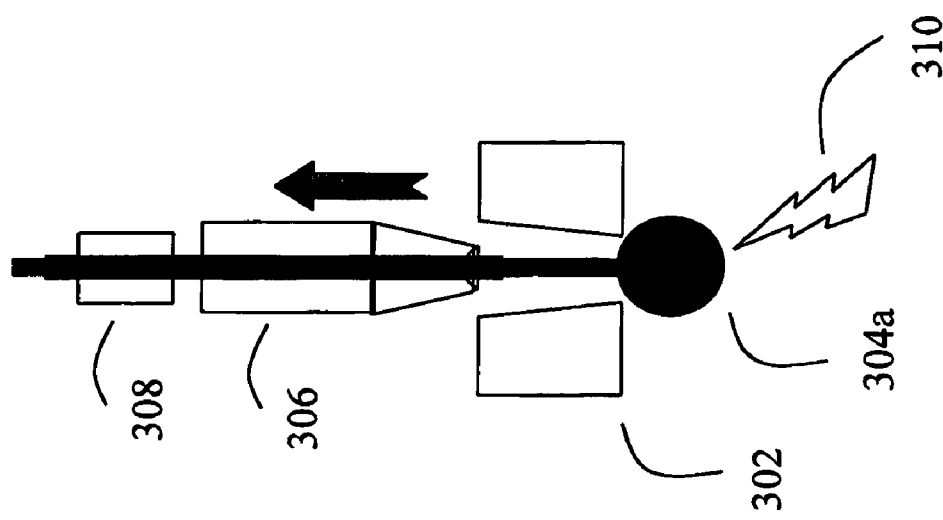
Figure 3A:
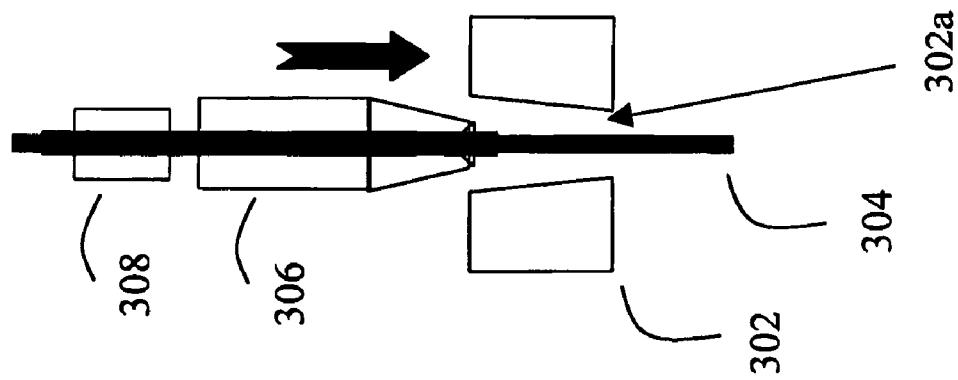

In FIG. 3A, wire bonding tool 306 is moved in a generally downward direction such that a portion of wire 304 is extended through aperture 302a defined by carrier structure 302, with wire clamp 308 in a closed position. Apertures 302a may be formed in any of a number of ways. For example, they may be pre-punched, pre-etched, or drilled before the wire bonding operations commences. Alternatively, apertures 302a may be formed by a laser or the like during the wire bonding operation.

In FIG. 3B, with wire clamp 308 still in a closed position, energy 310 (provided by an EFO wand or the like) is applied to an end of wire 304 to form free air ball 304a, and wire bonding tool 306 is raised towards the lower surface of carrier structure 302. In FIG. 3C, with wire clamp 308 still in a closed position, and with energy 310 still being applied to keep free air ball 304a warm, wire bonding tool 306 is further raised such that free air ball 304a seats itself (e.g., melt, become attached with an adhesive, etc.) into a portion of aperture 302a. More specifically, according to certain exemplary embodiments of the present invention, the warm free air ball 304a is melted into the plastic structure (e.g., a portion of the carrier is melted), thus being secured thereto. According to other exemplary embodiments of the present invention, the conductive ball (e.g., free air ball 304a) may be attached to the carrier structure at the aperture using an adhesive, or an adhesive in addition to a tapered aperture (where the aperture is larger at the surface of the carrier structure through which the conductive ball enters the aperture). Alternative configurations for securing the conductive ball to the carrier structure are also contemplated.

In FIG. 3D, with free air ball 304a in the seated position, and with wire clamp 308 in an open position, wire bonding tool 306 is manipulated to loop wire 304 towards integrated circuit device 312 supported by carrier structure 302, thereby forming a wire loop 316. In FIG. 3E, with wire clamp 308 in a closed position, after the end 314 of wire loop 316 is wire bonded to a contact pad (not shown) of integrated circuit device 312, wire 304 is cut/torn from bonded wire loop 316.

Figure 4:
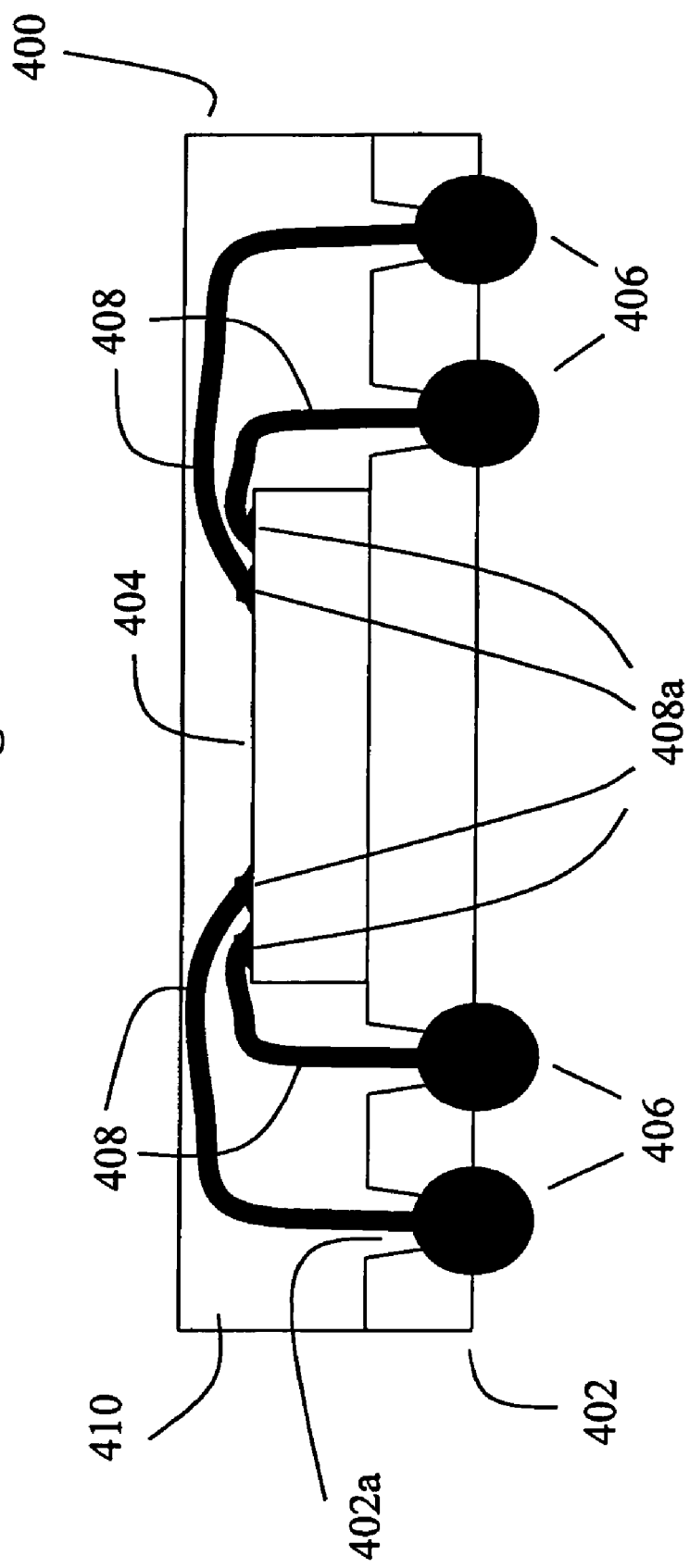
FIG. 4 is a side view of an encapsulated wire bonded semiconductor device with stacked wire bonds in accordance with an exemplary embodiment of the present invention.

FIG. 4 is a side view of semiconductor device 400. Semiconductor device 400 includes integrated circuit device 404 supported by carrier structure 402. Carrier structure 402 defines a number of apertures 402a that extend from (1) a first surface adjacent integrated circuit device 404 to (2) a second surface away from integrated circuit device 404. Wire loops 408 (with conductive balls 406 coupled thereto) extend from the lower surface of carrier structure 402 (through conductive balls 406) to bond points 408a which are bonded to contact pads (not shown) of integrated circuit device 404. Semiconductor device 400 includes encapsulant 410 which encapsulates integrated circuit device 404, conductor/wire loop 408, and a portion of conductive ball 406. As shown in FIG. 4, wire loops 408 are "stacked" above one another (one of the wire loops is at least partially positioned above another of wire loops 408) to provide a more efficiently spaced packaged semiconductor device 400.

Figure 5D:
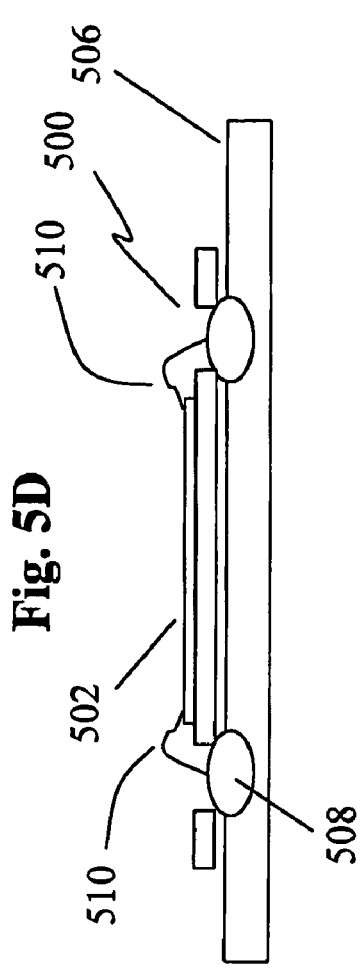
Figure 5E:
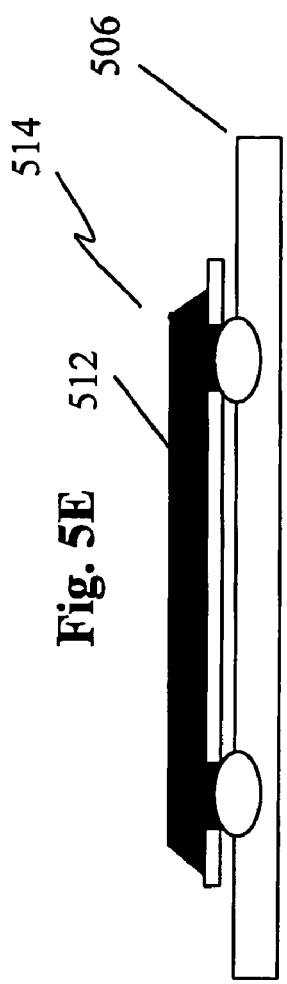
Figure 5F:
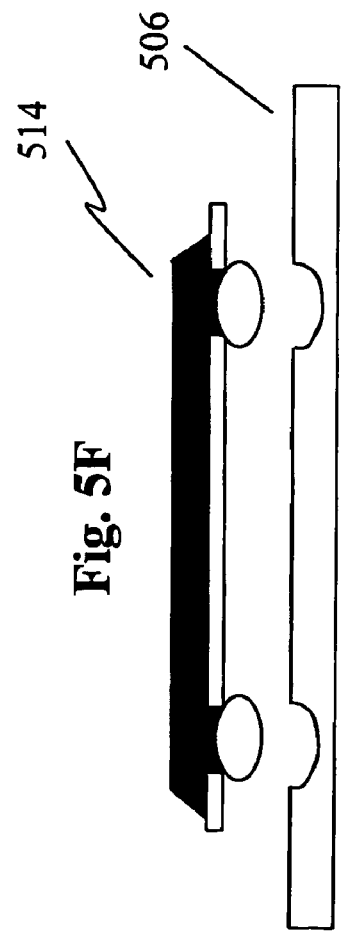

FIGS. 5A-5F illustrate an alternative exemplary embodiment of the present invention. While not limited thereto, this embodiment is particularly useful when a large ball is desired at the BGA side of the device. In FIG. 5A, semiconductor device 500 is illustrated and includes integrated circuit device 502 supported by carrier structure 504. Carrier structure 504 defines apertures 504a therethrough.

In FIG. 5B, stencil/template 506, which defines troughs 506a, is provided for the temporary processing of semiconductor devices. Conductive balls 508 (e.g., gold, copper, or Ag balls that are preformed) are positioned at least partially within troughs 506a. At FIG. 5C, semiconductor device 500 (including integrated circuit device 502 and carrier structure 504) is positioned above template 506 such that apertures 504a align with conductive balls 508.

At FIG. 5D, wire loops 510 are wire bonded between conductive balls 508 and contact pads (not shown) of integrated circuit device 502. At FIG. 5E, encapsulant 512 is provided over integrated circuit device 500 and wire loops 510 to form packaged semiconductor device 514. At FIG. 5F, packaged semiconductor device 514 is de-molded or otherwise separated from template 506.

Figure 6C:
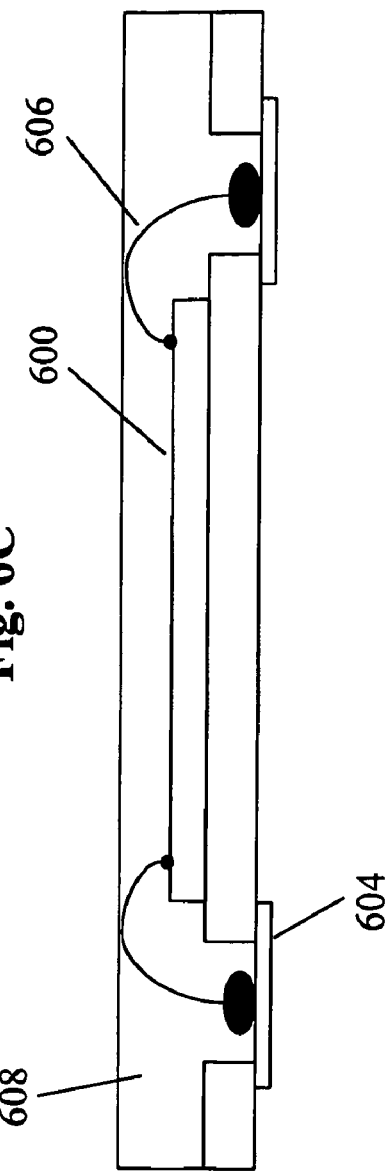

FIGS. 6A-6D illustrate another alternative exemplary embodiment of the present invention. While not limited thereto, this embodiment is particularly useful when a large ball is desired at the BGA side of the device. FIG. 6A illustrates integrated circuit device 600 supported by carrier structure 602. Carrier structure 602 defines apertures 602a below which are provided conductive contacts 604.

For example, carrier structure 602 may be formed from a plastic sheet. In processing, a conductive foil or the like may be disposed on a surface (the bottom surface in FIG. 6A) of the plastic sheet. The conductive foil may be selectively etched to form conductive contacts 604, and holes may be drilled, punched, etched or otherwise formed in the plastic sheet to form apertures 602a.

Figure 6D:
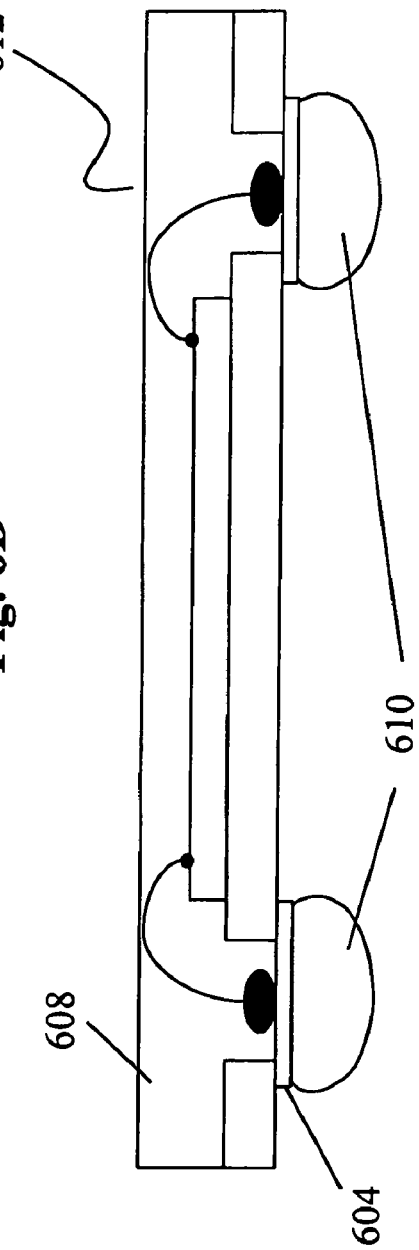

In FIG. 6B, wire loops 606 are wire bonded between conductive contacts 604 and contact pads (not shown) of integrated circuit device 600. In FIG. 6C, encapsulant 608 is provided over integrated circuit device 600 and wire loops 606. In FIG. 6D, solder balls are conductively coupled (e.g., using a solder reflow process) to the lower surface of conductive contacts 604, thereby forming a packaged semiconductor device.

Figure 7:
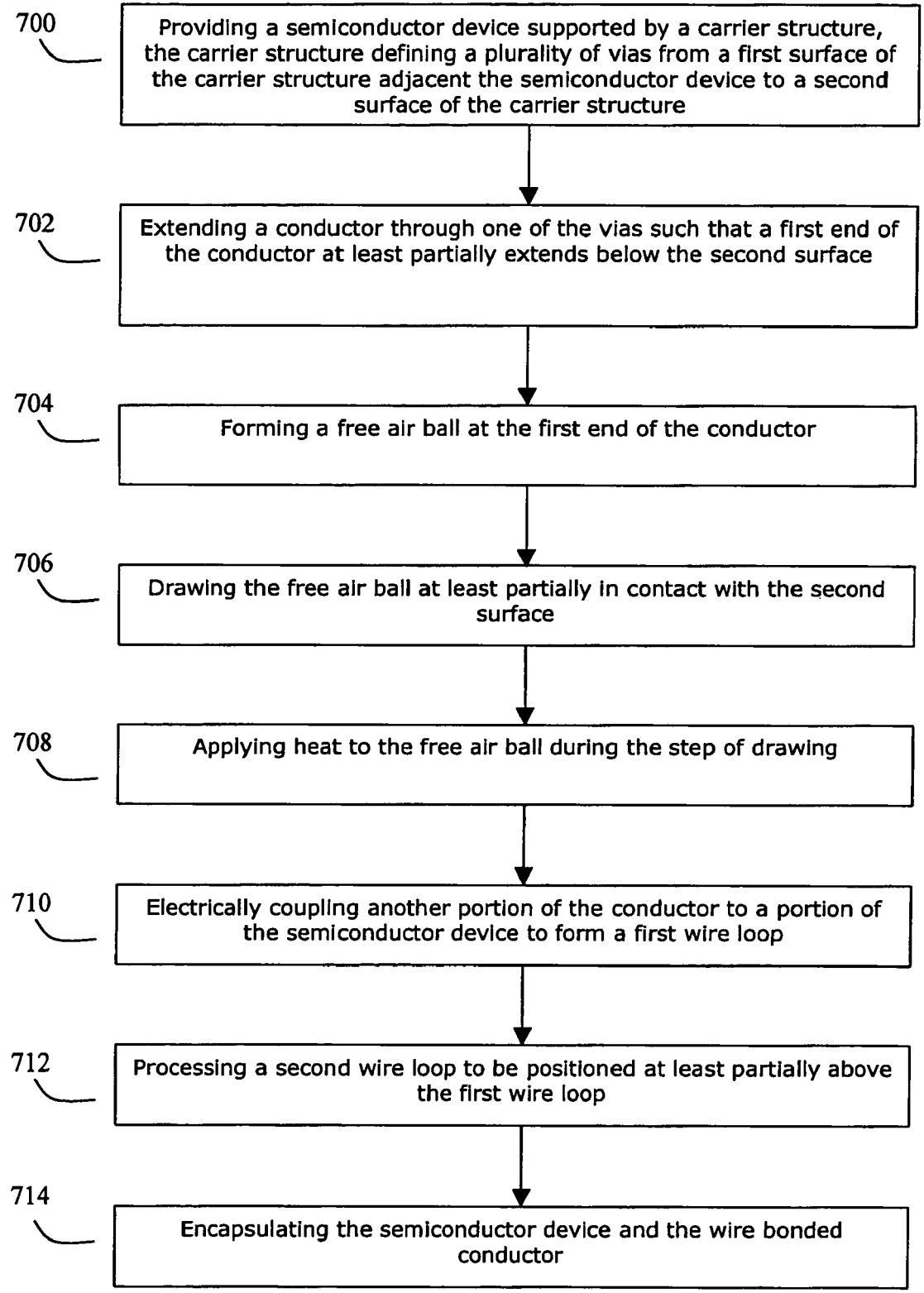
FIG. 7 is a flow diagram illustrating a method of processing a semiconductor/integrated circuit device in accordance with an exemplary embodiment of the present invention.
Figure 8:
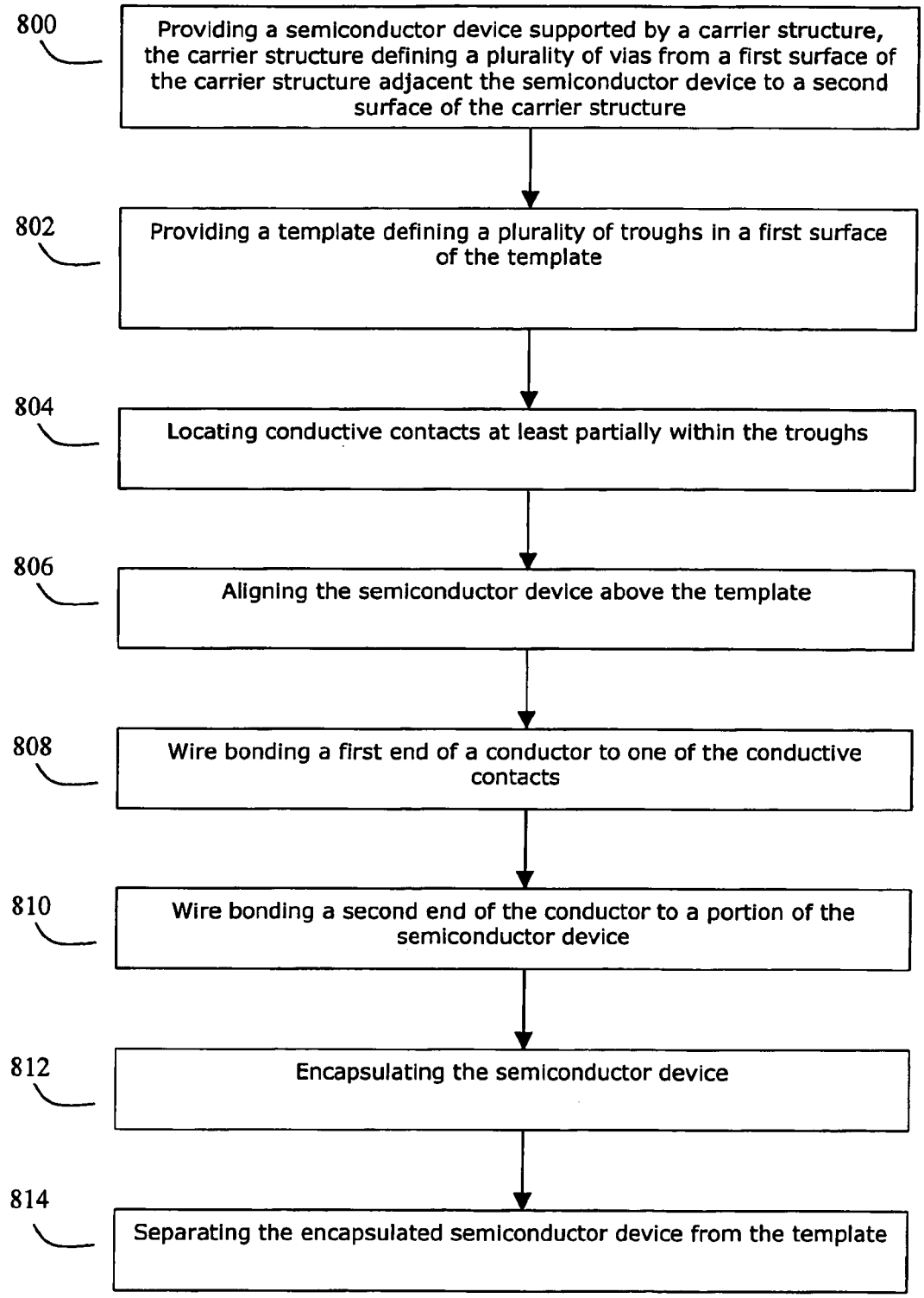
FIG. 8 is a flow diagram illustrating another method of processing a semiconductor/integrated circuit device in accordance with an exemplary embodiment of the present invention.
Figure 9:
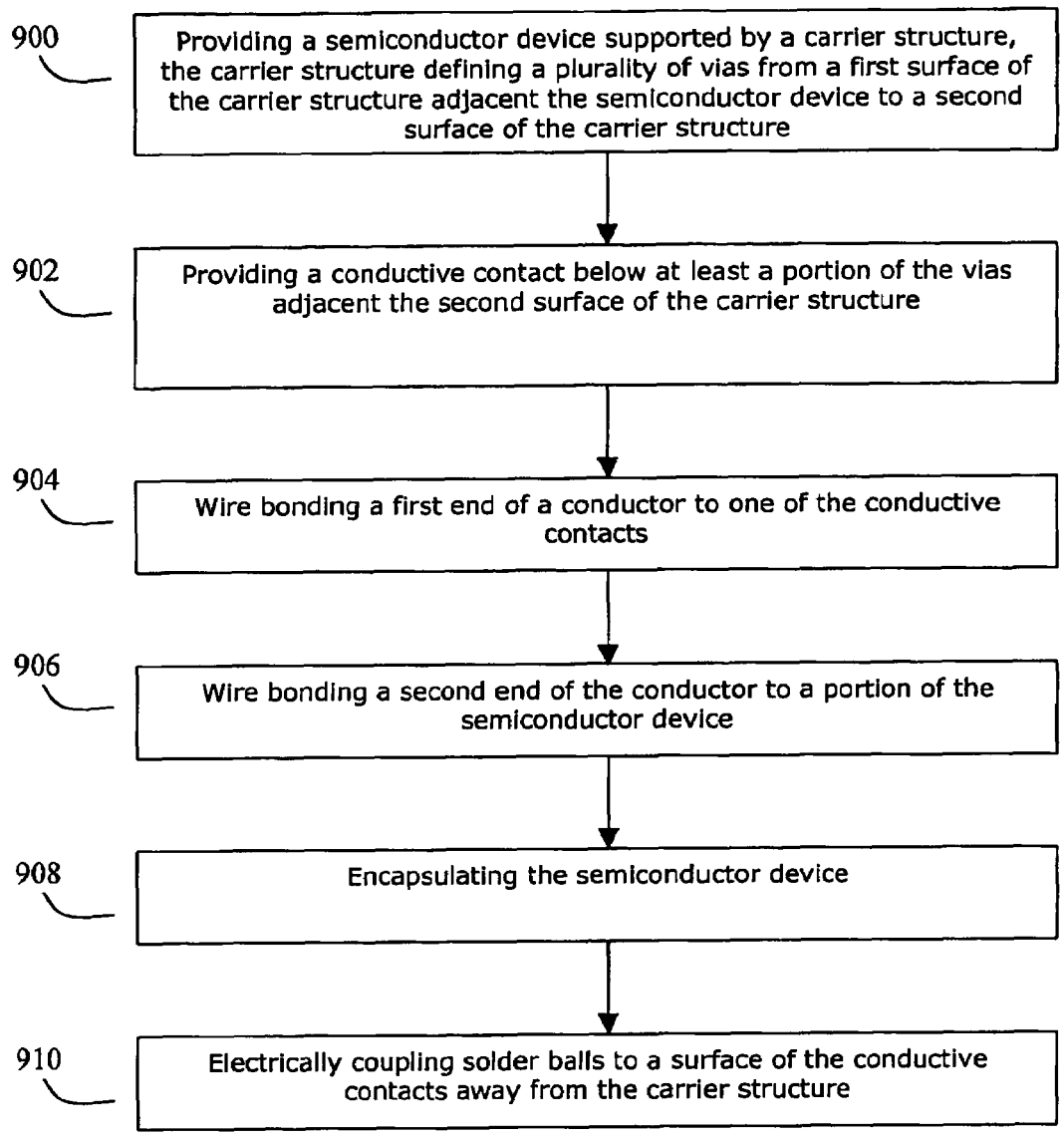
FIG. 9 is a flow diagram illustrating yet another method of processing a semiconductor/integrated circuit device in accordance with an exemplary embodiment of the present invention.

FIGS. 7-9 are flow diagrams illustrating methods of processing a semiconductor device in accordance with various exemplary embodiments of the present invention. More specifically, FIG. 7 relates generally to the exemplary structures illustrated in FIGS. 1-2, 3A-3E, and 4; however, the method of FIG. 7 is not limited to the exact configuration of these exemplary structures. Likewise, although FIG. 8 relates generally to the exemplary structures illustrated in FIGS. 5A-5F, the method of FIG. 8 is not limited to the exact configuration of these exemplary structures. Further still, although FIG. 9 relates generally to the exemplary structures illustrated in FIGS. 6A-6D, the method of FIG. 9 is not limited to the exact configuration of these exemplary structures. It is noteworthy that according to certain embodiments of the present invention, flow diagram steps illustrated in FIGS. 7-9 may be omitted, rearranged in order, or substituted.

Referring now to the exemplary processing method of FIG. 7, at step 700, a semiconductor device supported by a carrier structure is provided. For example, the carrier structure may include any of a number of materials, and have a range of thicknesses, so long as it satisfies the mechanical (and other requisite) qualities desired of such a carrier structure. For example, because of its low cost and machinability, sheet plastic is an exemplary material that may be used for the carrier structure. The carrier structure defines a plurality of vias from a first surface of the carrier structure adjacent the semiconductor device to a second surface of the carrier structure.

Further, a plurality of semiconductor devices may be processed at one time, wherein a plurality of integrated circuit devices are supported by a relatively large carrier structure, and after processing of the devices (e.g., wirebonding, encapsulating and the like), the carrier structure may be divided to provide a plurality of semiconductor devices.

At step 702, a conductor (e.g., a wire extending through a wire bonding tool) is extended through one of the vias such that a first end of the conductor at least partially extends below the second surface. At step 704, a free air ball is formed at the first end of the conductor. At step 706, the free air ball is drawn at least partially in contact with the second surface of the carrier structure. At step 708 (which may be contemporaous with step 706), heat is applied to the free air ball while the free air ball is drawn at least partially in contact with the second surface.

At step 710, another portion of the conductor (e.g., a second end) is electrically coupled to a portion of the semiconductor device (e.g., a contact pad of the semiconductor device). For example, step 710 may include wire bonding a second end of the conductor to a contact pad of the semiconductor device. According to an exemplary embodiment of the present invention, steps 702, 704, 706, 708, and 710 may be viewed as processing of a wire to form a first wire loop between two contact points (the conductive ball at the second surface of the carrier structure and a contact pad of the semiconductor device).

At step 712, another conductor may be processed to be a second wire loop as described above in steps 702, 704, 706, 708, and 710 such that the second wire loop is positioned at least partially above the first wire loop, thus providing a space efficient packaged semiconductor device.

At step 714, the semiconductor device (including the wire bonded conductor) is encapsulated to provide a packaged semiconductor device.

Referring now to the exemplary processing method of FIG. 8, at step 800 a semiconductor device supported by a carrier structure is provided. The carrier structure defines a plurality of vias from a first surface of the carrier structure adjacent the semiconductor device to a second surface of the carrier structure. At step 802, a template defining a plurality of troughs in a first surface of the template is provided. At step 804, conductive contacts are located at least partially within the troughs. At step 806, the semiconductor device is aligned above the template such that at least a portion of the plurality of vias align with respective ones of the conductive contacts. At step 808, a first end of a conductor is wire bonded to one of the conductive contacts, and at step 810, a second end of the conductor is wire bonded to a portion of the semiconductor device (e.g., a contact pad of the semiconductor device). At step 812, the semiconductor device and the wire bonded conductor are encapsulated. At step 814, the encapsulated semiconductor device (along with the carrier structure and conductive contacts) is separated from the template to provide a packaged semiconductor device.

Referring now to the exemplary processing method of FIG. 9, at step 900 a semiconductor device supported by a carrier structure is provided. The carrier structure defines a plurality of vias from a first surface of the carrier structure adjacent the semiconductor device to a second surface of the carrier structure. At step 902 (which may be considered as a part of step 900), a conductive contact is provided below at least a portion of the vias adjacent the second surface of the carrier structure. For example, a conductive layer (e.g., a copper foil or the like) may be provided adjacent the second surface of the carrier structure, and selected portions of the conductive layer may be etched to form the conductive contacts. At step 904, a first end of a conductor is wire bonded to one of the conductive contacts. At step 906, a second end of the conductor is wire bonded to a portion of the semiconductor device (e.g., a contact pad of the semiconductor device). At step 908, the semiconductor device and the wire bonded conductors are encapsulated. At step 910, solder balls are electrically coupled to a surface of the conductive contacts away from the carrier structure.

Through the methods described above, the present invention provides significant improvement over conventional semiconductor processing techniques. For example, a relatively expensive multi-layer printed circuit board with plated vias may be avoided, and a simple carrier structure (e.g., a plastic sheet) may be utilized. Further, a substantial amount of soldering done in conventional processing may be avoided, for example, using the wire bonding techniques disclosed herein. Further still, through the techniques disclosed herein (e.g., by forming a second wire bond on the semiconductor die), a smaller packaged device may be provided.

Other benefits of the present invention include reduced processing/assembly costs, improved electrical performance (e.g., current capacity, resistance, and inductance), and improved thermal performance.

The present invention, while not limited thereto, is particularly useful in peripheral area array applications, where the contacts on the lower surface of the carrier structure (the surface opposite the semiconductor die) are not directly below the semiconductor die, but are rather provided about the periphery of the die. Such an exemplary die may be a DRAM die (i.e., dynamic random access memory), where the conductive balls/spheres provided on the lower surface of the carrier structure are not provided directly below the die.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of processing a semiconductor device, the method comprising the steps of:
   providing a semiconductor device supported by a carrier structure, the carrier structure defining a plurality of vias from a first surface of the carrier structure adjacent the semiconductor device to a second surface of the carrier structure;
   extending a conductor through one of the vias such that a first end of the conductor at least partially extends below the second surface, wherein the plurality of vias defined by the carrier structure are pre-defined prior to the extending step;
   forming a free air ball at the first end of the conductor after the step of extending;
   drawing the free air ball at least partially in contact with the second surface; and
   electrically coupling another portion of the conductor to a portion of the semiconductor device.

2. The method of claim 1 wherein the step of drawing includes applying heat to the free air ball.

3. The method of claim 1 wherein the electrically coupling step includes wire bonding a second end of the conductor to a contact pad of the semiconductor device.

4. The method of claim 3 further comprising the steps of:
   extending another conductor through another of the vias such that a first end of the another conductor at least partially extends below the second surface;
   forming another free air ball at the first end of the another conductor after the step of extending, and drawing the another free air ball at least partially in contact with the second surface; and
   wire bonding a second end of the another conductor to a portion of the semiconductor device such that a wire loop formed during the step of wire bonding a second end of the another conductor is positioned at least partially above another wire loop formed during the step of wire bonding a second end of the conductor.

5. The method of claim 3 further comprising the step of encapsulating the semiconductor device and the conductor after the step of electrically coupling.

6. The method of claim 1 wherein the step of drawing includes melting a portion of the carrier structure in contact with the free air ball such that the free air ball is secured to the carrier structure.

7. The method of claim 1 wherein the step of drawing includes adhesively coupling the free air ball and the carrier structure.

8. The method of claim 1 wherein the step of drawing includes drawing the free air ball at least partially within one of the apertures adjacent the second surface, the aperture adjacent the second surface being tapered, and adhesively coupling the free air ball and the carrier structure at the tapered aperture.

9. The method of claim 1 wherein the step of providing includes providing a plurality of the semiconductor devices on the carrier structure, and further comprising the step of dividing the carrier structure into a plurality of semiconductor devices after the step of electrically coupling.

10. The method of claim 1 wherein the step of providing includes providing includes the carrier structure to define the plurality of vias such that the vias are tapered from the first surface to the second surface.

11. The method of claim 10 wherein the step of providing includes providing includes the carrier structure to define the plurality of vias such that the vias have a larger opening at the first surface in comparison to a smaller opening at the second surface.

* * * * *